(12) United States Patent
Matoba (10) Patent No.: US 7,366,747 B2
(45) Date of Patent: Apr. 29, 2008

(54) DIGITAL FILTER CIRCUIT AND DATA PROCESSING METHOD

(75) Inventor: Kenjiro Matoba, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 604 days.

(21) Appl. No.: 10/775,325

(22) Filed: Feb. 11, 2004

(65) Prior Publication Data

US 2004/0230627 A1 Nov. 18, 2004

(30) Foreign Application Priority Data

Feb. 12, 2003 (JP) ............................ 2003-033756

(51) Int. Cl.
*G06F 17/10* (2006.01)
(52) U.S. Cl. ...................... 708/316; 708/300
(58) Field of Classification Search .............. 708/316, 708/300
See application file for complete search history.

(56) References Cited

U.S. PATENT DOCUMENTS

| 3,717,754 | A | * | 2/1973 | Buzzard et al. | ............. | 708/316 |
| 5,904,731 | A | * | 5/1999 | Matsui | ....................... | 708/603 |
| 6,674,812 | B1 | * | 1/2004 | Stevenson | .................... | 375/302 |
| 2003/0177157 | A1 | * | 9/2003 | Matoba | ...................... | 708/316 |

FOREIGN PATENT DOCUMENTS

| JP | 08-032409 | 2/1996 |
| JP | 2003-264451 | 9/2003 |

* cited by examiner

*Primary Examiner*—Tan V. Mai
(74) *Attorney, Agent, or Firm*—Rabin & Berdo, PC (57) ABSTRACT

A digital filter circuit is capable of processing multi-channel data having different sampling frequencies. RAMs (random access memories) are provided which store data inputted thereto respectively, and the data outputted from the RAMs are alternately processed.

13 Claims, 8 Drawing Sheets

CIRCUIT CONFIGURATION OF FIRST EMBODIMENT

FIG. 1

CIRCUIT CONFIGURATION OF FIRST EMBODIMENT

Fig. 2

TIMING CHART OF FIRST EMBODIMENT

FIG. 3

CIRCUIT CONFIGURATION OF SECOND EMBODIMENT

Fig. 4

TIMING CHART OF SECOND EMBODIMENT

FIG. 5

CIRCUIT CONFIGURATION OF THIRD EMBODIMENT

Fig. 6

TIMING CHART OF THIRD EMBODIMENT

FIG. 7

CIRCUIT CONFIGURATION OF FOURTH EMBODIMENT

Fig. 8

TIMING CHART OF FOURTH EMBODIMENT

US 7,366,747 B2

DIGITAL FILTER CIRCUIT AND DATA PROCESSING METHOD

BACKGROUND OF THE INVENTION

1. Field of the Invention

The present invention relates to a digital filter circuit used in audio, a voice memorandum, etc., and particularly to a decimation filter.

2. Description of the Related Art

A decimation filter is a circuit wherein data such as voice is partly thinned out to thereby carry out its compression. There is also known a decimation filter that has the function of removing noise produced due to its compression. The conventional decimation filter is capable of processing single-channel data or data of multi-channel each having the same sampling period. The prior art has been described in, for example, Japanese Unexamined Patent Publication No. Hei 8 (1996)-32409 and Japanese Unexamined Patent Publication No. 2003-264451.

However, only the single conventional decimation filter cannot process data of multi-channel having different sampling periods. When the multi-channel data having the different sampling periods are processed using the conventional decimation filter, it is necessary to match their sampling frequencies with one another before the respective data of multi-channel are inputted to the decimation filter or provide decimation filters every channels. When the former method is used, degradation in sound quality due to the frequency matching-up occurs. When the latter method is used, a circuit scale increases.

SUMMARY OF THE INVENTION

With the foregoing problems in view, it is therefore an object of the present invention to provide a digital filter circuit comprising a plurality of RAMs respectively inputted with data, registers that latch the data outputted from the RAMs, a cumulative arithmetic unit, and a selector that alternately outputs the data outputted from the registers, to the cumulative arithmetic unit.

According to the present invention, since the registers compute the respective data in accordance with the sampling frequencies respectively, a decimation filter computation is enabled by one digital filter alone while the respective sampling frequencies are being held, even when the multi-channel data having the different sampling frequencies are inputted.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Preferred embodiments of the present invention will hereinafter be described in detail with reference to the accompanying drawings.

Figure 1:
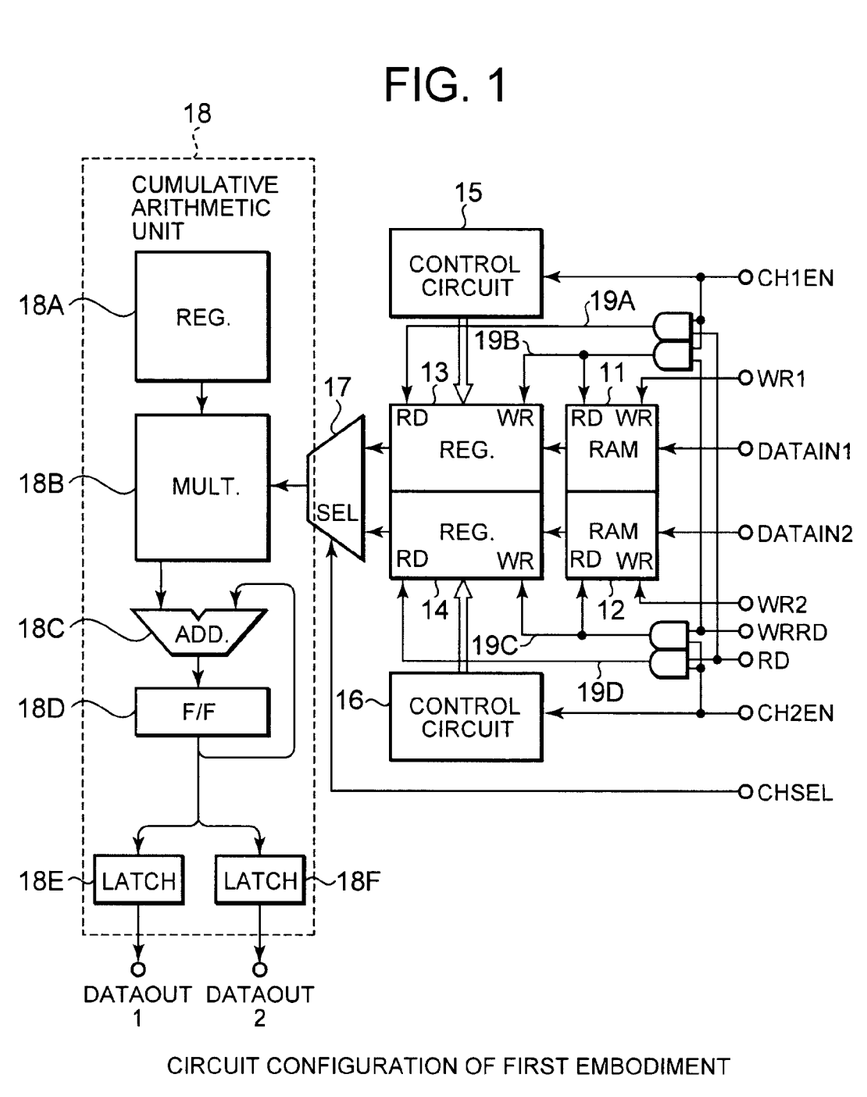
FIG. 1 is a circuit diagram showing a first embodiment of the present invention.
Figure 2:
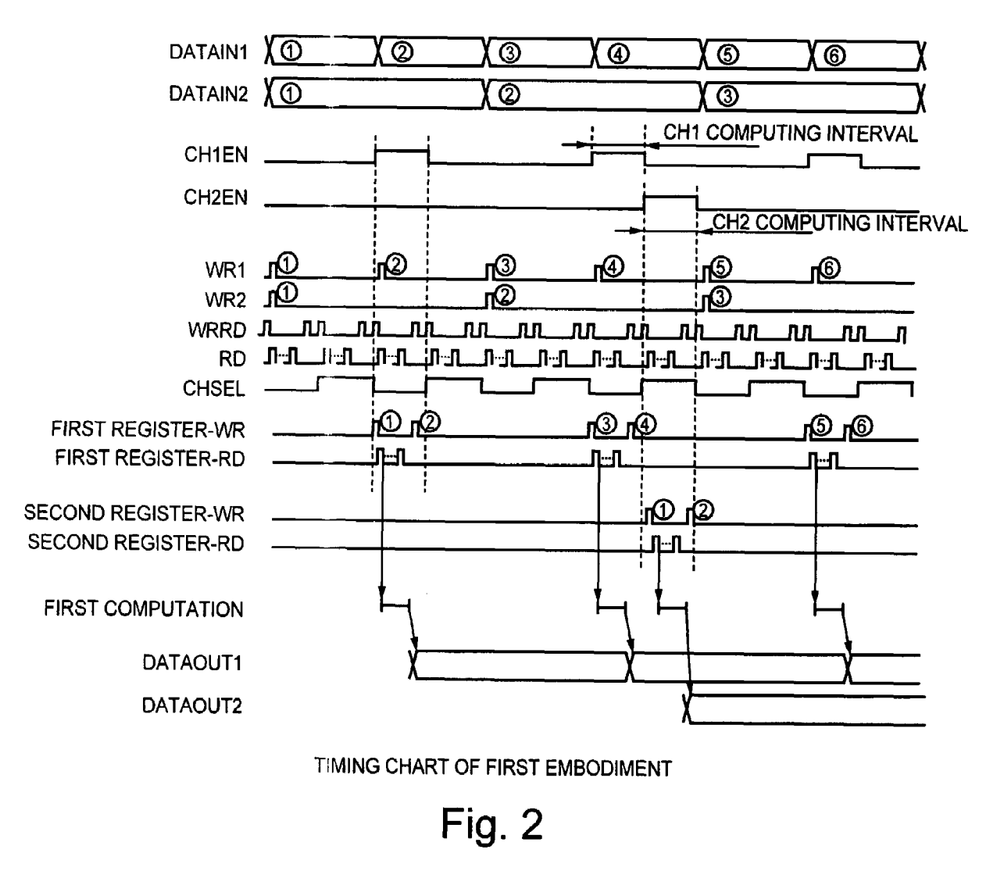
FIG. 2 is a timing chart illustrating the operation of the first embodiment of the present invention.

FIG. 1 is a circuit diagram showing a first embodiment of the present invention. FIG. 2 is a timing chart illustrating its operation. The first embodiment of the present invention will be described below based on FIGS. 1 and 2.

A digital filter circuit showing the first embodiment of the present invention comprises a first RAM 11, a second RAM 12, a first register 13 and a second register 14, a first register control circuit 15 and a second register control circuit 16, a selector 17, and a cumulative arithmetic unit 18. The cumulative arithmetic unit 18 comprises a filter factor storage register 18A, a multiplier 18B, an adder 18C, a D-flip flop (hereinafter abbreviated as D-F/F) 18D, a first latch circuit 18E and a second latch circuit 18F.

The first RAM 11 outputs data contained therein side to the first register 13. The first register 13 computes the data inputted from the first RAM 11 and outputs the computed data to the selector 17. Further, the first register control circuit 15 controls the operation of the first register 13.

Similarly, the second RAM 12 outputs data held therein side to the second register 14. The second register 14 computes the data inputted from the second RAM 12 and outputs the computed data to the selector 17. Further, the second register control circuit 16 controls the operation of the second register 14. Incidentally, a FIFO (First In First Out) type RAM having the function of temporarily storing input data and outputting the data in order of their input is used for each of the first and second RAMs.

The selector 17 selects either the first register 13 or the second register 14 and outputs data inputted from the selected register to the cumulative arithmetic unit 18.

Further, the digital filter circuit according to the first embodiment of the present invention has respective input terminals DATAIN1, DATAIN2, CH1EN, CH2EN, WR1, WR2, WRRD and CHSEL and further includes first through fourth AND circuits. The respective terminals are connected to the RAMs and registers either directly or via the first through fourth AND circuits.

The DATAIN1 and DATAIN2 are terminals for inputting data to the RAMs respectively and are respectively connected to the first RAM 11 and the second RAM 12.

The WR1 and WR2 are terminals for inputting signals for writing data into the RAMs respectively and are respectively connected to the first RAM 11 and the second RAM 12.

The CH1EN and CH2EN are respectively terminals for inputting signals for operating the registers and the register control circuits respectively and causing data to be transferable from the RAMs to the registers and from the registers to the selector respectively. The CH1EN is connected to the first register control circuit 15. Also the CH1EN is connected to an input terminal of the first AND circuit 19A together with an RD and connected even to an input terminal of the second AND circuit 19B together with the WRRD. Similarly, the CH2EN is connected to the second register control circuit 16. Also the CH2EN is connected to an input terminal of the fourth AND circuit 19D together with the RD and connected even to an input terminal of the third AND circuit 19C together with the WRRD.

The WRRD is a terminal for inputting a signal for transferring data latched in the RAMs to the registers and writing the data into the registers. The terminal WRRD is connected to an input terminal of the second AND circuit 19B together with the CH1EN. Also the terminal WRRD is connected to an input terminal of the third AND circuit 19C together with the CH2EN.

The RD is a terminal for inputting a signal for reading the data latched in the registers and transferring the same to the selector 17. The terminal RD is connected to an input terminal of the first AND circuit 19A together with the CH1EN. Also the terminal RD is connected even to an input terminal of the fourth AND circuit 19D together with the CH2EN.

The CHSEL is a terminal for inputting a signal for determining whether either the data of the first register 13 or the data of the second register 14 should be transferred to the cumulative arithmetic unit 18, to the selector 17. The terminal CHSEL is connected to the selector 17.

The first AND circuit 19A is a circuit for generating a signal for transferring the data latched in the first register to the selector 17. The first AND circuit 19A inputs the signals sent from the RD and the CH1EN and outputs a signal to the first register 13.

The second AND circuit 19B is a circuit for generating a signal for transferring the data latched in the first RAM to the first register 13 and writing the data into the first register 13. The second AND circuit 19B inputs the signals sent from the WRRD and the CH1EN and outputs a signal to the first RAM 11 and the first register 13.

The third AND circuit 19C is a circuit for generating a signal for transferring the data latched in the second RAM 12 to the second register and writing the data into the second register 14. The third AND circuit 19C inputs the signals sent from the WRRD and the CH2EN and outputs a signal to the second RAM 12 and the second register 14.

The fourth AND circuit 19D is a circuit for generating a signal for transferring the data latched in the second register 14 to the selector 17. The fourth AND circuit 19D inputs the signals from the RD and CH2EN and outputs a signal to the second register 14.

The operation of the first embodiment of the present invention will next be described using FIG. 2.

In the present embodiment, data inputted from the DATAIN1 and data inputted from the DATAIN2 are alternately processed. Which data should be processed depends on the signal inputted from the CH1EN and the signal inputted from the CH2EN. When the signal inputted from the CH1EN is of an H level, the data inputted from the DATAIN1 is processed, whereas when the signal inputted from the CH2EN is of an H level, the data inputted from the DATAIN2 is processed. Incidentally, the data inputted from the DATAIN1 and the data inputted from the DATAIN2 are in sync with each other in sampling period. The sampling period of the data inputted from the DATAIN1 is equal to one-half the sampling period of the data inputted from the DATAIN2. The sampling period of the data inputted from the DATAIN1 is called simply "sampling period" below. Further, the periods of the signal inputted from the CH1EN and the signal inputted from the CH2EN are in sync with the sampling period similarly. The signal inputted from the CH1EN is brought to an H level every two sampling periods, and the signal inputted from the CH2EN is brought to an H level every four sampling periods.

Processing to be effected on the data inputted from the DATAIN1 will first be described.

Data are sequentially transmitted from the DATAIN1 ever sampling periods. A high level signal is inputted from the WR1 in accordance with the sampling period. The WR1 is a terminal for inputting a signal for writing data into the first RAM 11. Thus, the data sent from the DATAIN1 terminal are written into the first RAM 11 in order. That is, the data ① sent from the DATAIN1 is written into the first RAM 11 in accordance with the high level signal ① inputted from the WR1, and the data ② inputted from the DATAIN1 is written into the first RAM 11 in accordance with an H level ② inputted from the WR1.

On the other hand, a signal for operating the register and the register control circuit respectively and allowing the transfer of the data latched in the first RAM 11 is inputted from the CH1EN. As mentioned previously, the computation of sampling of the data latched in the first RAM 11 and its transfer are enabled while the CH1EN is H in level.

Further, a signal for reading the data latched in the corresponding RAM and transferring it to the register is inputted from the WRRD. The signal inputted from the WRRD reaches an H level immediately after the signal inputted from the CH1EN is brought to the H level. Afterwards, the signal is restored to an L level once and thereafter inputted with such timing as to assume the H level again. When the CH1EN is brought to the H level, the data ① has already been written into the first RAM 11 in response to the signal inputted from the WR1. An H level signal is inputted from the WRRD simultaneously when the CH1EN is brought to the H level. That is, since the signal for transferring the data is inputted in the state in which the data transfer is being allowed, the data ① latched in the first RAM 11 is read simultaneously when the CH1EN is brought to the H level, followed by being transferred to the first register 13.

Subsequently, a signal for transferring the data latched in the corresponding register to the selector 17 is inputted from the RD. In response to the signal, the data ① is read from the first register 13 and transferred to the selector 17. When the CH1EN is H in level, the CHSEL is of an L level and hence the selector 17 is placed in a state in which the signal sent from the first register 13 is transferred to the cumulative arithmetic unit 18. Thus, the data ① transferred to the selector 17 is further transferred to the cumulative arithmetic unit 18.

On the other hand, when the CH1EN is brought to the H level, the data ② is just inputted from the DATAIN1. Immediately thereafter, an H level signal ② is inputted from the WR1 and the data ② is written into the first RAM 11. Further, subsequently, the data ② latched in the first RAM 11 is also transferred to the first register 13 in accordance with the input of the high level signal from the WRRD.

Immediately thereafter, however, the CH1EN is returned to the L level. That is, the transfer of data results in a prohibited state. Thus, the data ② remains in the first register 13 and is hence not transferred to the selector 17. Finally, the first register 13 is overwritten with the data ② when new data ③ is transferred to the first register 13, so that the data ② disappears.

When the above series of operations are considered as a whole, the data transmitted from the DATAIN1 is sampling-computed by the first RAM 11, the first register 13 and the selector 17 and eventually transferred to the cumulative arithmetic unit 18. Of the data sent from the DATAIN1, only the data ① is transferred to the cumulative arithmetic unit 18 and the data ② disappears within the first register 13. As a result, the amount of all data is compressed to half.

On the other hand, data are sequentially transmitted from the terminal DATAIN2 every two sampling periods. When an H level signal ① is inputted from the WR2, the data ① is written into the second RAM 12. The subsequent operation is similar to the case in which the data transmitted from the DATAIN1 is processed.

In the present embodiment, however, the data are sent from the DATAIN2 in two sampling periods. Therefore, the periods in which the CH2EN and WR2 become H in level, are respectively twice the periods in which the CH1EN and WR1 become H in level.

Further, as mentioned previously, the selector 17 determines in accordance with a signal inputted from the CHSEL whether either data sent from the first register 13 or data sent from the second register 14 should be outputted to the cumulative arithmetic unit 18. In the present embodiment, when the CHSEL is L in level, the data of the first register 13 is outputted to the cumulative arithmetic unit 18, and when the CHSEL is H in level, the data of the second register 14 is outputted to the cumulative arithmetic unit 18. Thus, since the data transmitted from the first register 13 and the second register 14 are alternately outputted to the cumulative arithmetic unit 18, both data are blended in the cumulative arithmetic unit 18.

In the cumulative arithmetic unit 18, the multiplier 18B cuts unnecessary data and the adder 18C performs computing for comparison with past data, whereby noise developed by data compression is corrected. Thereafter, the data can also be re-separated by the D-F/F 18D. The re-separated data are outputted to the outside through the first latch circuit 18E and the second latch circuit 18F.

In the first embodiment of the present invention as described above, the periods in which the CH1EN and CH2EN are respectively brought to the H level, are respectively varied in accordance with the sampling periods of the input data. As a result, the halves of the respective data are thinned out and compressed by the registers and the so-processed data are alternately outputted to the cumulative arithmetic unit by the selector, thereby making it possible to blend the respective data. Then, the noise produced due to the compression of the data is removed at a time by the single cumulative arithmetic unit after the respective data have been blended. It is thus possible to process multi-channel data respectively having different sampling periods by a single decimation filter. Therefore, an increase in circuit scale can be suppressed to the minimum. It is also unnecessary to synchronize the respective sampling periods with one another before the respective data of multi-channel are inputted to the decimation filter employed in the present embodiment. Accordingly, degradation in sound quality due to frequency matching-up does not occur either.

Incidentally, although the sampling period of the data inputted from the DATAIN2 is set to twice the sampling period of the data inputted from the DATAIN1 in the present embodiment, the ratio between input sampling frequencies is not limited to 2 in particular but can be set arbitrarily.

Figure 3:
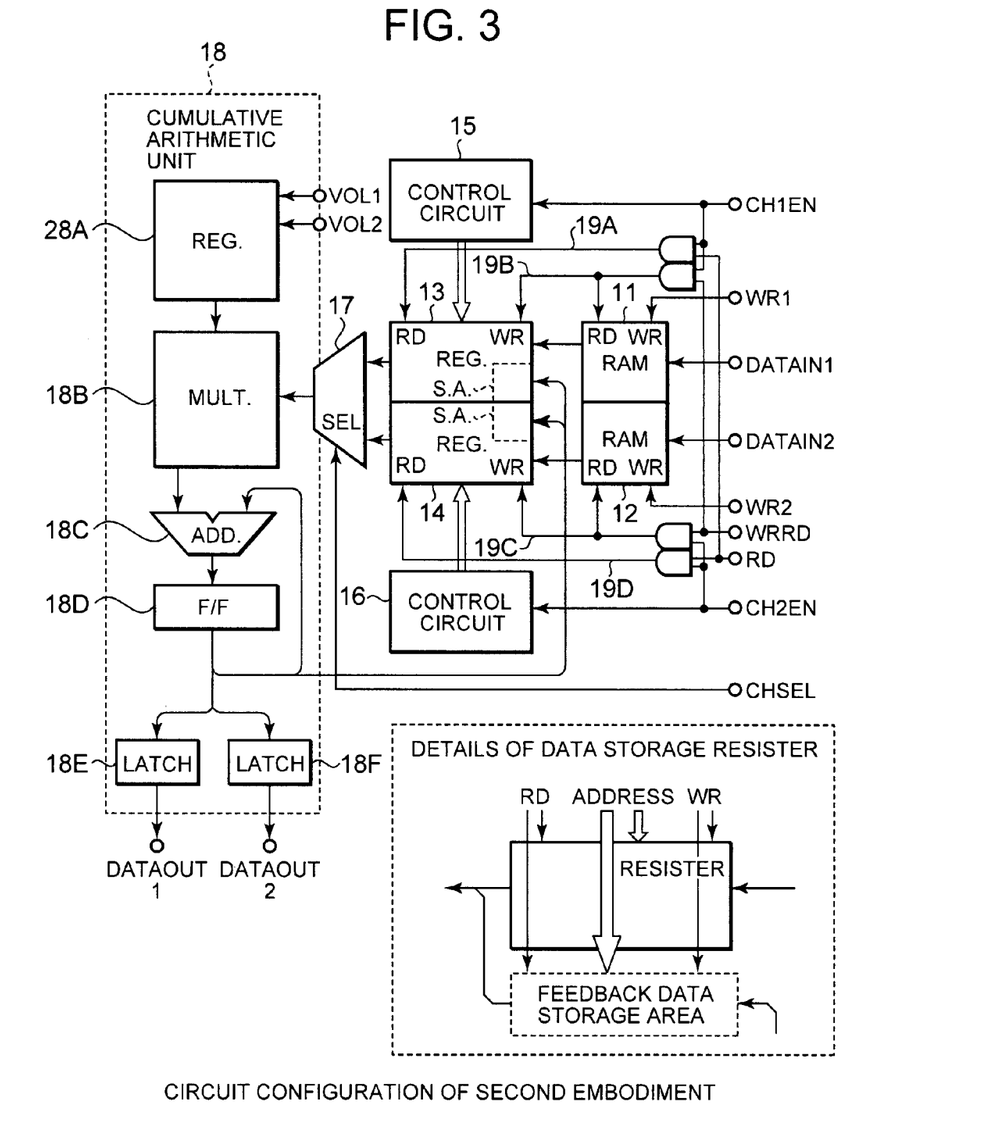
FIG. 3 is a circuit diagram depicting a second embodiment of the present invention.
Figure 4:
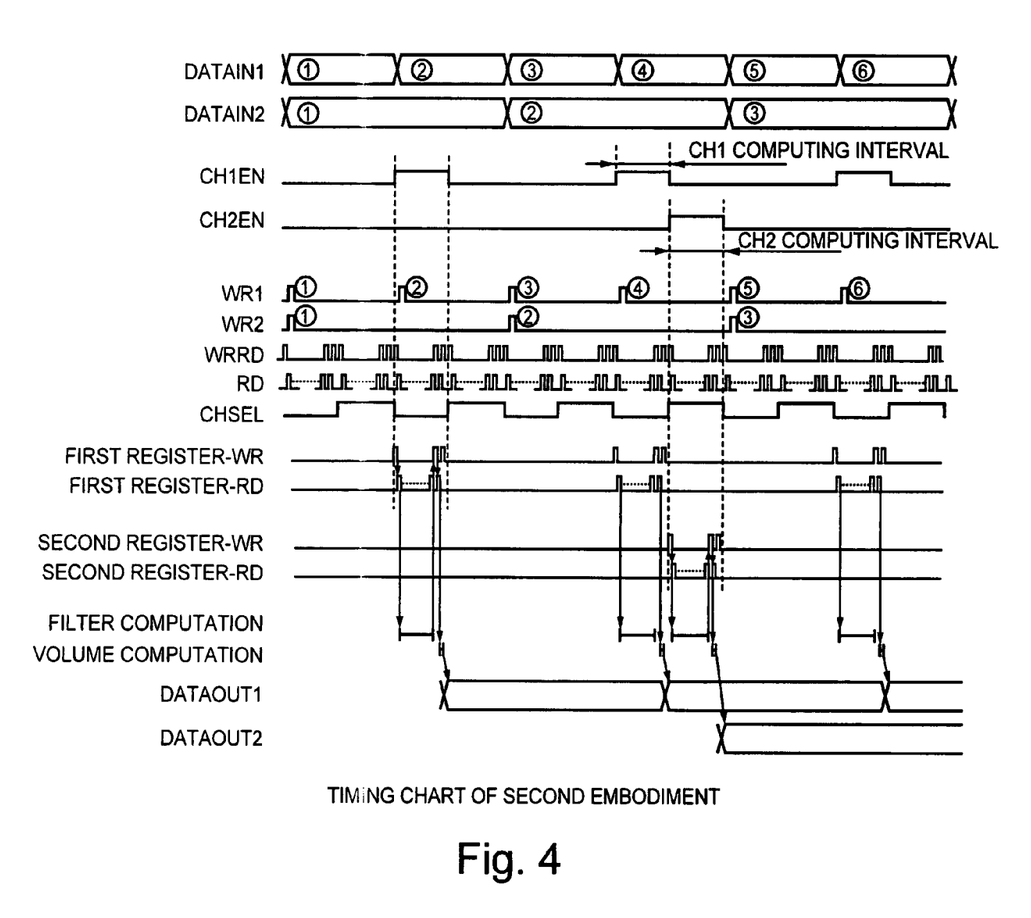
FIG. 4 is a timing chart showing the operation of the second embodiment of the present invention.

FIG. 3 is a circuit diagram showing a second embodiment of the present invention. FIG. 4 is a timing chart for describing its operation. The second embodiment of the present invention will be described below based on FIGS. 3 and 4.

In a digital filter circuit according to the second embodiment of the present invention, an output produced from a D-F/F 18D of a cumulative arithmetic unit 18 is fed back to a first register 13 and a second register 14. The first register 13 and the second register 14 respectively have storage areas of the fedback data. The feedback data storage areas are controlled by an RD and WRs.

Further, the filter factor storage register 18A employed in the first embodiment is used as a filter factor/Volume factor storage register 28A which stores even a Volume factor therein.

The digital filter circuit according to the second embodiment of the present invention is identical to the first embodiment except for the points described above.

The operation of the second embodiment of the present invention will next be described using FIG. 4.

The second embodiment is also identical to the first embodiment up to the transfer of data inputted from DATAIN1 and DATAIN2 to the cumulative arithmetic unit 18. However, the second embodiment is different from the first embodiment in that data passed through the D-F/F 18D in the cumulative arithmetic unit 18 and filter-computed is fed back to the first register 13 or the second register 14.

The fedback data is written into the first register 13 or the second register 14 when an H level signal is inputted to the corresponding WR again. Since the cumulative arithmetic unit 18 includes the filter factor/Volume factor storage register 28A therein, a Volume computation can be effected on data to be fed back before its feedback. When an H level signal is inputted to the RD, the corresponding data is read from the first register 13 or the second register 14 to the cumulative arithmetic unit 18 again.

The operation other than the above description is identical to the first embodiment.

Since a circuit substantially similar to the first embodiment performs a substantially similar operation in the second embodiment of the present invention as described above, an advantageous effect identical to the first embodiment is brought about. Further, the Volume-computed data is fed back to the corresponding data storage register, a filter function can be added without almost increasing a circuit scale.

Figure 5:
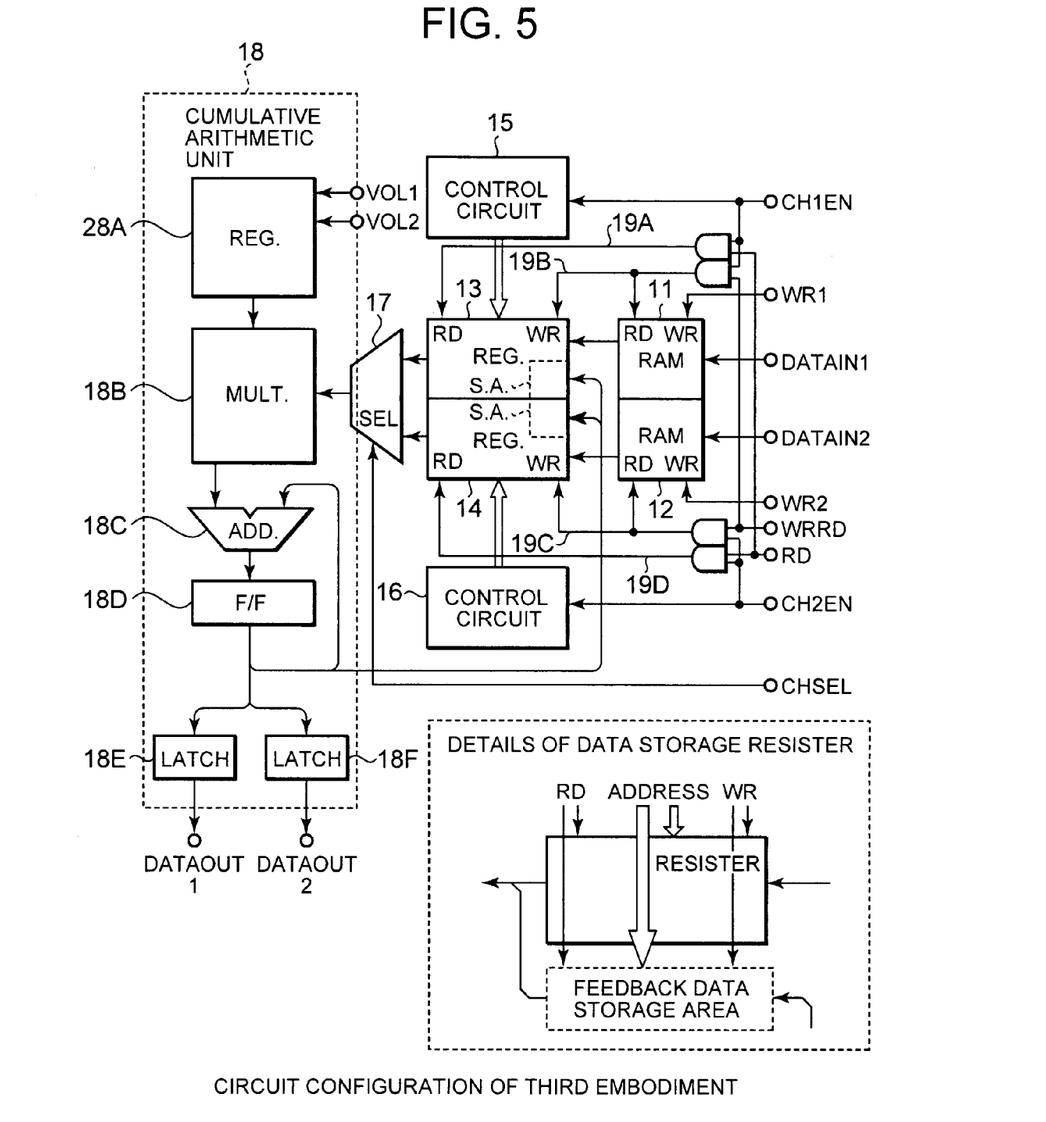
FIG. 5 is a circuit diagram illustrating a third embodiment of the present invention.
Figure 6:
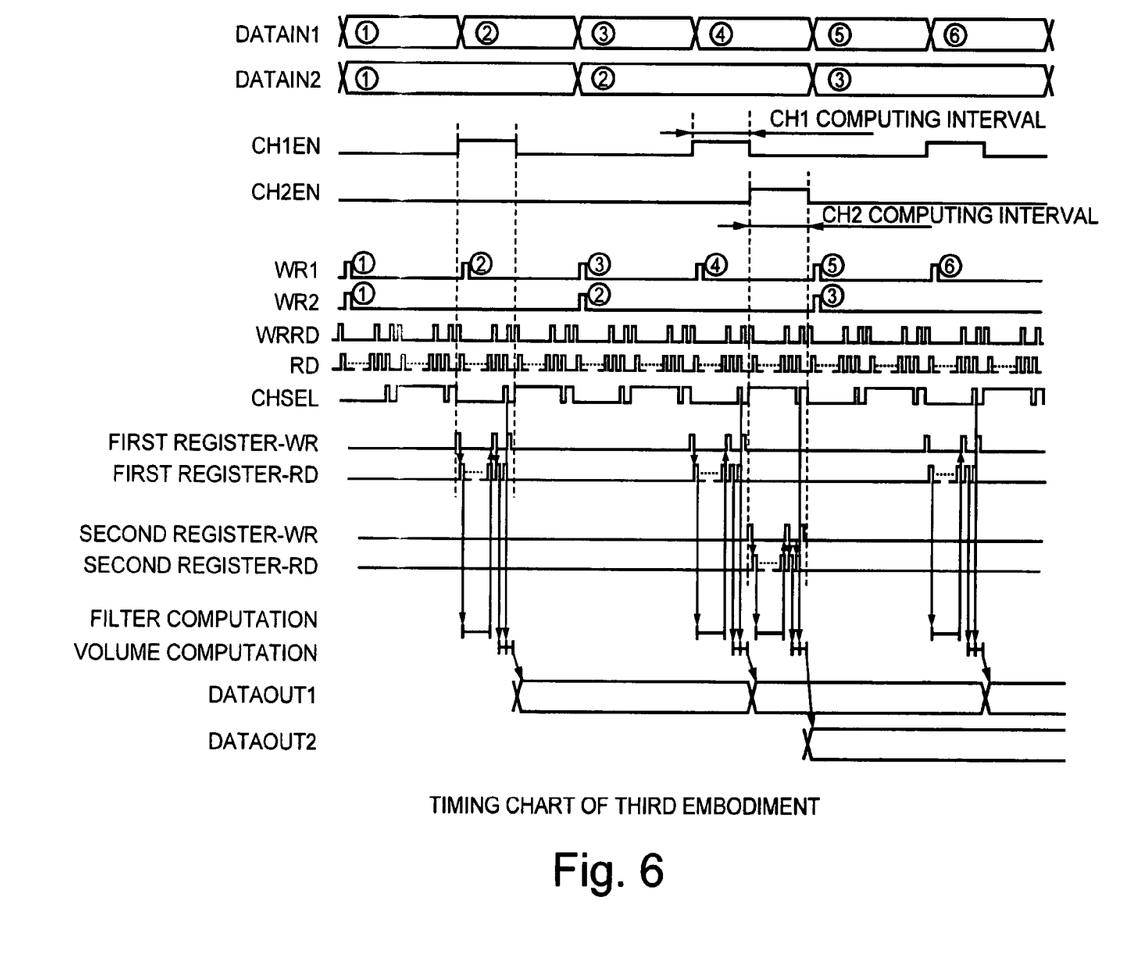
FIG. 6 is a timing chart depicting the operation of the third embodiment of the present invention.

FIG. 5 is a circuit diagram showing a third embodiment of the present invention. FIG. 6 is a timing chart showing the operation of the third embodiment. The third embodiment of the present invention will be explained below based on FIGS. 5 and 6.

The third embodiment of the present invention is similar to the second embodiment in circuit configuration.

On the other hand, the operation thereof is as follows. When data latched in a first register 13 is being processed, CHSEL is temporarily brought to an H level and an H level signal is inputted from an RD, thereby outputting data on the second register 14 side to a cumulative arithmetic unit 18.

Since a circuit substantially similar to the second embodiment performs a substantially similar operation in the third embodiment of the present invention as described above, an advantageous effect identical to the second embodiment is brought about. Further, when the data latched in the first register 13 is being processed, the CHSEL is temporarily set to the H level and the H level signal is inputted from the RD, whereby the data on the second register 14 side is outputted to the cumulative arithmetic unit 18, thus making it possible to cause the circuit to have a mixing function.

Figure 7:
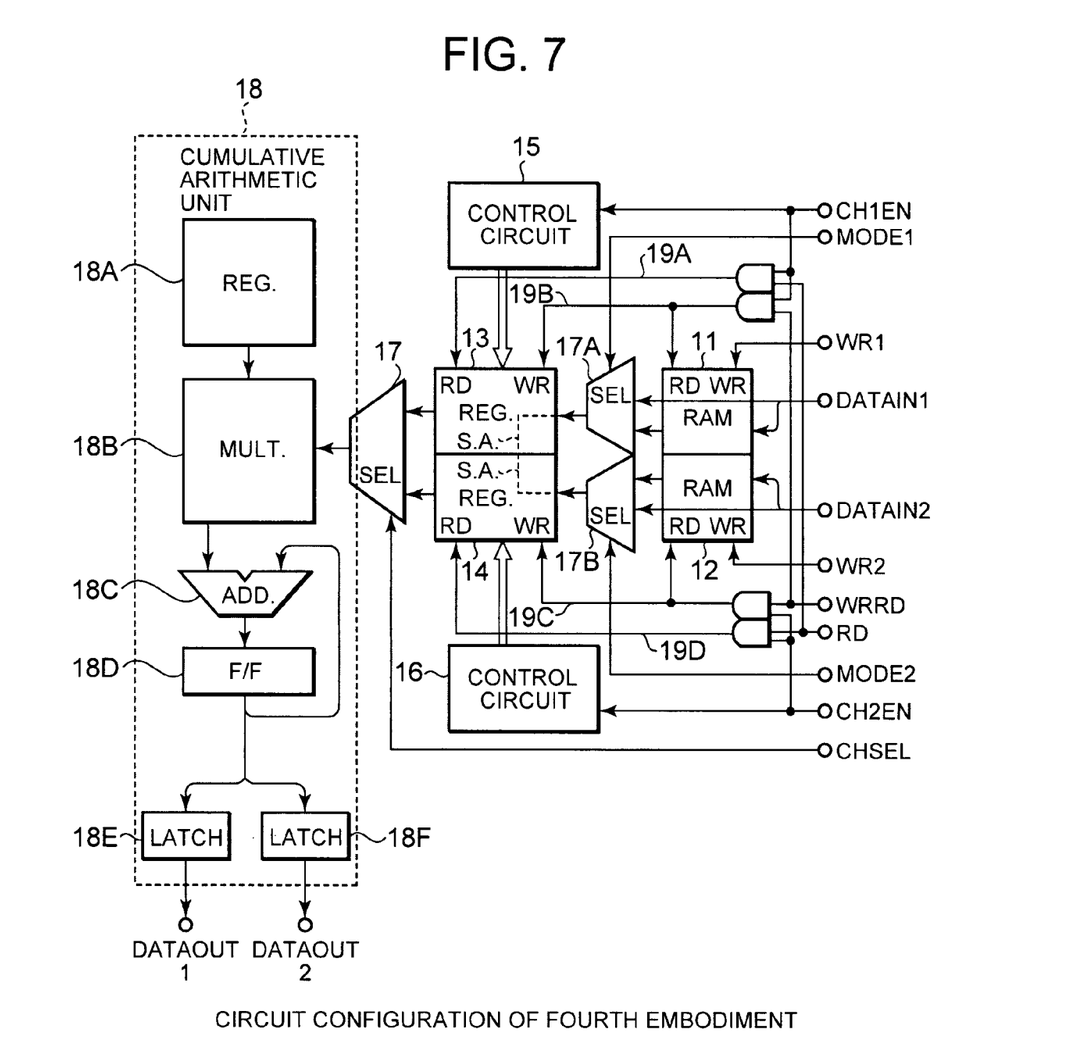
FIG. 7 is a circuit diagram showing a fourth embodiment of the present invention.
Figure 8:
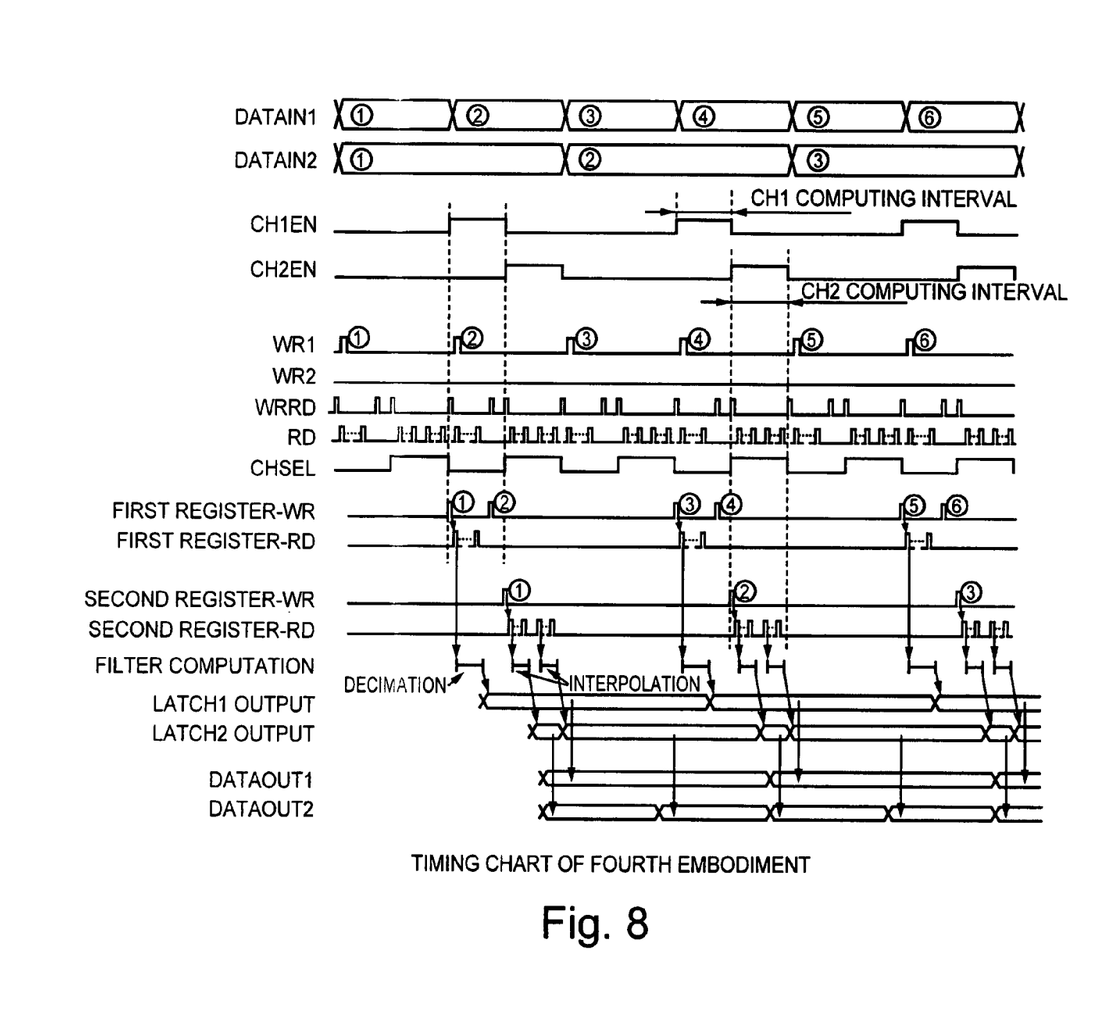
FIG. 8 is a timing chart illustrating the operation of the fourth embodiment of the present invention.

FIG. 7 is a circuit diagram showing a fourth embodiment of the present invention. FIG. 8 is a timing chart for describing its operation. The fourth embodiment of the present invention will be described below based on FIGS. 7 and 8.

A digital filter circuit according to the fourth embodiment of the present invention has three selectors. Of these, the selector 17A selects either a signal latched in a first RAM 11 or a signal inputted from a DATAIN1 and outputs it to a first register 13. The selector 17B selects either a signal latched in a second RAM 12 or a signal inputted from a DATAIN2 and outputs it to a second register 14. The selector 17C is similar to the selector 17 employed in the first embodiment.

Further, the digital filter circuit according to the fourth embodiment of the present invention has respective terminals of MODE1 and MODE2 in addition to the circuit according to the first embodiment. Of these, the MODE1 terminal is a terminal for inputting a signal for determining whether either the data inputted from the DATAIN1 or the data of the first RAM 11 should be transmitted to the first register 13, and is connected to the selector 17A. The MODE2 terminal is a terminal for inputting a signal for determining whether either the data inputted from the DATAIN2 or the data of the second RAM 12 should be transmitted to the second register 14, and is connected to the selector 17B.

The digital filter circuit according to the fourth embodiment of the present invention is identical to the first embodiment except for the points explained above.

The operation of the fourth embodiment of the present invention will next be explained using FIG. 8.

First, the selectors 17A and 17B are operated through the MODE1 and MODE2 in such a manner that data inputted from the DATAIN1 is latched in the first RAM 11 and data inputted from the DATAIN2 is directly inputted to the second register 14 without being latched in the second RAM 12. Since the selector 17A sends the data inputted thereto from the first RAM 11 to the first register 13, the processing of the data inputted from the DATAIN1 is identical to the first embodiment.

On the other hand, the selector 17B directly inputs the data inputted from the DATAIN2 to the second register 14 without via the second RAM 12. When a CH2EN is of an H level, the data ① inputted from the DATAIN2 is directly written into the second register 14 in accordance with an H level signal inputted from a WRRD.

In the present embodiment unlike other embodiments, the CH2EN reaches the H level in the same period as that of the data sent from the DATAIN2. Thus, each time data is transmitted from the DATAIN2, the data is written into the second register 14 in each case. The data ① written into the second register 14 is outputted to a cumulative arithmetic unit 18 in accordance with an H level signal sent from an RD. That is, since the data written into the second register is always equivalent to one period of the data sent from the DATAIN2, the data sent from the DATAIN2 is fully outputted to the cumulative arithmetic unit 18 without disappearing in mid course.

In the present embodiment, the H level signal is inputted twice from the RD while the CH2EN is being H in level. By doing in this way, the data ① can be outputted to the cumulative arithmetic unit twice and hence the data can be interpolated.

The present embodiment is identical to the first embodiment in operation other than above description.

Since a circuit substantially similar to the first embodiment performs a substantially similar operation in the fourth embodiment of the present invention as described above, an advantageous effect identical to that obtained in the first embodiment is brought about. Further, since the selectors are placed between the RAMs and the data storage registers respectively to provide the functions of selecting whether the data inputted from the DATAIN1 and DATAIN2 are temporarily stored in the RAMs respectively, it is possible to dare not to thin out the data inputted from the DATAIN1 or DATAIN2.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A digital filter circuit comprising:
    a first RAM that stores sequentially input data having a first sampling period and sequentially outputs the data stored in the first RAM;
    a second RAM that stores sequentially input data having a second sampling period sequentially outputs the data stored in the second RAM;
    a first register that stores the data sequentially outputted from the first RAM and sequentially outputs the data stored in the first register;
    a second register that stores the data sequentially outputted from the second RAM and sequentially outputs the data stored in the second register;
    a cumulative arithmetic unit that computes the data outputted from the first register and the second register; and
    a selector that alternately outputs the data outputted from the first register and the second register to the cumulative arithmetic unit.

2. A digital filter circuit according to claim 1, wherein the data having the first sampling frequency or the data having the second sampling frequency is caused to partly disappear by overwriting new data on the data within the first register or the second register.

3. A digital filter circuit according to claim 1, wherein the data computed by the cumulative arithmetic unit is fed back to the first register or the second register.

4. A digital filter circuit according to claim 1, wherein the selector is operated to mix the data outputted from the first register or the second register with data outputted from the other register.

5. A digital filter circuit according to claim 1, wherein the digital filter circuit also has a mode in which the data having the first sampling period is directly inputted to the first register without being stored in the first RAM.

6. A digital filter circuit according to claim 1, wherein the cumulative arithmetic unit includes a multiplier and an adder that adds data outputted from the multiplier.

7. A digital filter circuit according to claim 1, wherein the data having a first sampling period is digitized first audio data, wherein the data having a second sampling period is digitized second audio data, and wherein the cumulative arithmetic unit outputs some of the digitized first and second audio data to thereby provide first and second audio data in compressed form.

8. A data processing method comprising the steps of:
    sequentially inputting data having a first sampling period to a first RAM and storing the data having the first sampling period in the first RAM, wherein the data having a first sampling period is digitized first audio data;
    sequentially inputting data having a second sampling period to a second RAM and storing the data having the second sampling period in the second RAM, wherein the data having a second sampling period is digitized second audio data;

sequentially outputting data sent from the first RAM to a first register and storing data sent from the first RAM in the first register;

sequentially outputting data sent from the second RAM to a second register and storing the data sent from the second RAM in the second register;

alternately outputting data from sent the first register and the second register to a cumulative arithmetic unit; and computing the data outputted to the cumulative arithmetic unit so as to output some of the digitized first and second audio data from the cumulative arithmetic unit to thereby provide first and second audio data in compressed form.

9. A data processing method according to claim 8, further comprising the step of causing the data having the first sampling frequency or the data having the second sampling frequency to partly disappear by overwriting new data on the data within the first register or the second register.

10. A data processing method according to claim 8, further comprising the step of feeding back the data computed by the cumulative arithmetic unit to the first register or the second register.

11. A data processing method according to claim 8, further comprising the step of mixing the data outputted from the first register or the second register with data outputted from the other register.

12. A data processing method according to claim 8, wherein the method includes a mode in which the data having the first sampling period in input directly to the first register without being stored in the first RAM.

13. A data processing method according to claim 8, wherein the cumulative arithmetic unit includes a multiplier and an adder that adds data outputted from the multiplier.

* * * * *